(12) United States Patent
Barik et al.

(10) Patent No.: US 11,658,025 B2
(45) Date of Patent: May 23, 2023

(54) CHALCOGEN PRECURSORS FOR DEPOSITION OF SILICON NITRIDE

(71) Applicants: Applied Materials, Inc., Santa Clara, CA (US); National University of Singapore, Singapore (SG)

(72) Inventors: Chandan Kr Barik, West Bengal (IN); Michael Haverty, Mountain View, CA (US); Muthukumar Kaliappan, Fremont, CA (US); Cong Trinh, Santa Clara, CA (US); Bhaskar Jyoti Bhuyan, San Jose, CA (US); John Sudijono, Singapore (SG); Anil Kumar Tummanapelli, Telangana (IN); Richard Ming Wah Wong, Singapore (SG); Yingqian Chen, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 237 days.

(21) Appl. No.: 17/151,240

(22) Filed: Jan. 18, 2021

(65) Prior Publication Data

US 2022/0230874 A1    Jul. 21, 2022

(51) Int. Cl.
*H01L 21/02* (2006.01)
*C23C 16/34* (2006.01)
*C23C 16/44* (2006.01)
*C23C 16/455* (2006.01)

(52) U.S. Cl.
CPC ...... *H01L 21/02211* (2013.01); *C23C 16/345* (2013.01); *C23C 16/4408* (2013.01); *C23C 16/45553* (2013.01); *H01L 21/0217* (2013.01); *H01L 21/0228* (2013.01)

(58) Field of Classification Search
None
See application file for complete search history.

(56) References Cited

U.S. PATENT DOCUMENTS

| | | | |
|---|---|---|---|
| 8,129,555 | B2 | 3/2012 | Cheng et al. |
| 8,741,688 | B2 | 6/2014 | Quick et al. |
| 9,240,319 | B2 | 1/2016 | Gatineau et al. |
| 9,382,268 | B1 * | 7/2016 | Kuchenbeiser ......... C07F 7/025 |

(Continued)

FOREIGN PATENT DOCUMENTS

WO    2018017317 A1    1/2018

OTHER PUBLICATIONS

Weeks, Stephen, et al., "Plasma enhanced atomic layer deposition of silicon nitride using neopentasilane (Abstract only)", Journal of Vacuum Science & Technology A 34, 01A140 (2016).

(Continued)

*Primary Examiner* — Asok K Sarkar
(74) *Attorney, Agent, or Firm* — Servilla Whitney LLC

(57) ABSTRACT

Chalcogen silane precursors are described. Methods for depositing a silicon nitride ($Si_xN_y$) film on a substrate are described. The substrate is exposed to the chalcogen silane and a reactant to deposit the silicon nitride ($Si_xN_y$) film. The exposures can be sequential or simultaneous. The chalcogen silane may be substantially free of halogen. The chalcogen may be selected from the group consisting of sulfur (S), selenium (Se), and tellurium (Te).

12 Claims, 1 Drawing Sheet

(56) References Cited

U.S. PATENT DOCUMENTS

| | | |
|---|---|---|
| 9,929,006 B2 | 3/2018 | Quick et al. |
| 2008/0318443 A1* | 12/2008 | Kim ................. C23C 16/45553 |
| | | 438/785 |
| 2013/0071580 A1 | 3/2013 | Weidman |
| 2014/0273528 A1 | 9/2014 | Niskanen et al. |
| 2015/0099375 A1 | 4/2015 | Haripin |
| 2018/0025906 A1 | 1/2018 | Quick et al. |
| 2018/0197735 A1 | 7/2018 | Quick et al. |

OTHER PUBLICATIONS

PCT International Search Report and Written Opinion in PCT/US2022/012700 dated May 4, 2022, 11 pages.

* cited by examiner

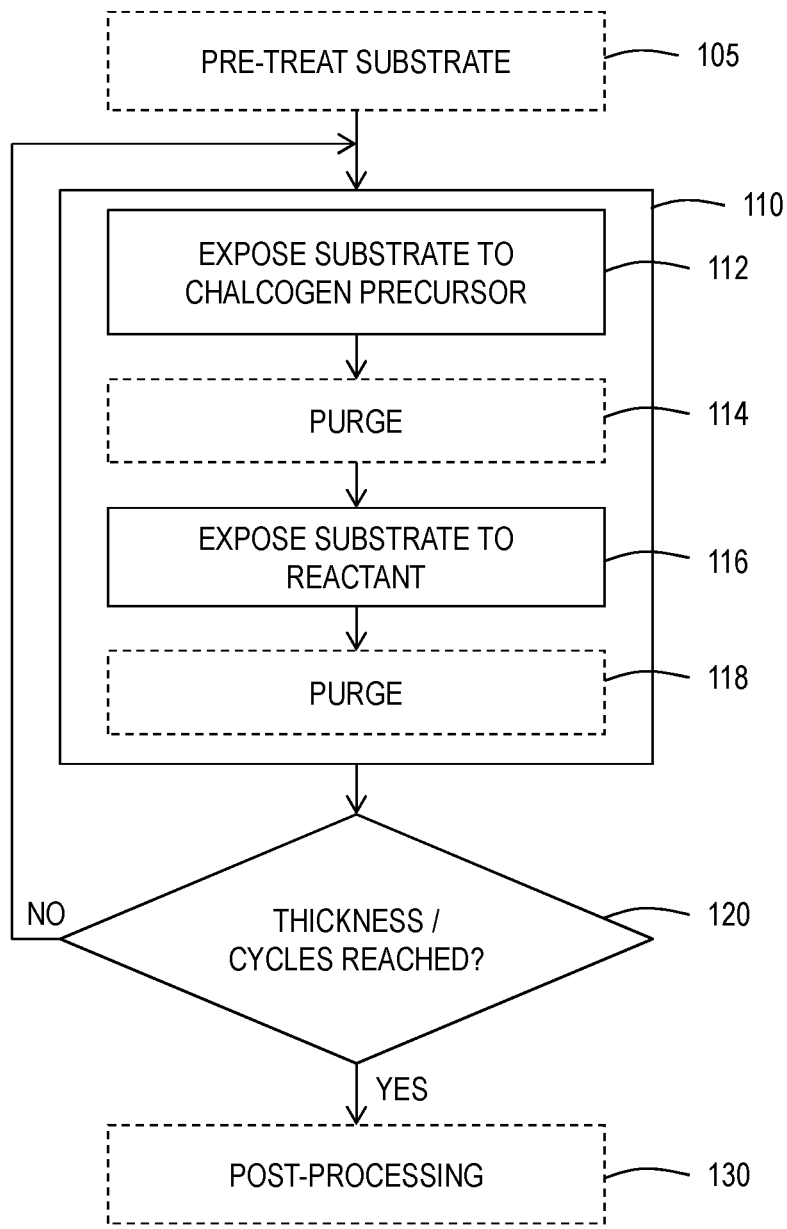

CHALCOGEN PRECURSORS FOR DEPOSITION OF SILICON NITRIDE

TECHNICAL FIELD

Embodiments of the disclosure relate to chalcogen precursors and methods for depositing chalcogen containing films. More particularly, embodiments of the disclosure are directed to chalcogen precursors containing sulfur (S), selenium (Se) and/or tellurium (Te) and methods of depositing them.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The advancing complexity of advanced microelectronic devices is placing stringent demands on currently used deposition techniques. Unfortunately, there are a limited number of viable chemical precursors available that have the requisite properties of robust thermal stability, high reactivity, and vapor pressure suitable for film growth to occur. In addition, precursors that often meet these requirements still suffer from poor long-term stability and lead to thin films that contain elevated concentrations of contaminants such as oxygen, nitrogen, and/or halides that are often deleterious to the target film application.

Silicon nitride ($Si_xN_y$) films have attractive material and conductive properties. These films have been proposed and tested for applications from front end to back end parts of semiconductor and microelectronic devices. However, most of the current state-of-art approaches for atomic layer deposition of silicon nitride ($Si_xN_y$) films are based on silane precursors which contain halogens. The halogen contamination may affect device performance and hence require additional removal procedures. Also, sometimes, halogen removal requires higher thermal budget. The uses of high temperature processes are not desirable for temperature-sensitive substrates (e.g. logic devices). There is, therefore, a need in the art for silane precursors that are free of halogen and that react to form silicon nitride ($Si_xN_y$) films at lower temperature.

SUMMARY

One or more embodiments of the disclosure are directed to a method of depositing a film. In one or more embodiments, the method comprises: exposing a substrate to a chalcogen precursor; and exposing the substrate to a reactant to form a silicon nitride ($Si_xN_y$) film on the substrate.

Other embodiments are directed to methods of depositing halogen-free films. In one or more embodiments, the method comprises: forming a silicon nitride ($Si_xN_y$) film in a process cycle comprising sequential exposure of a substrate to a chalcogen precursor, purge gas, reactant, and purge gas.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

FIG. 1 illustrates a process flow diagram of a method in accordance with one or more embodiments of the disclosure.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Embodiments of the disclosure provide precursors and processes for depositing silicon nitride ($Si_xN_y$) films. The precursor comprises a chalcogen precursor. In one or more embodiments, the chalcogen precursor comprises a quaternary chalcogen silane. In some embodiments, the chalcogen precursor comprises a silane having one or more chalcogens or derivatives thereof. In some embodiments, the chalcogen is selected from the group consisting of sulfur (S), selenium (Se), and tellurium (Te). In some embodiments, the chalcogen precursor comprises a pseudohalide derivative of chalcogen. In some embodiments, the pseudohalide derivative comprises thiocyanate, isothiocyanate, selenocyanate and/or tellurocyanate.

In some embodiments, the chalcogen precursor is substantially free of halogen. As used herein, the term "substantially free" means that there is less than about 5%, including less than about 4%, less than about 3%, less than about 2%, less than about 1%, and less than about 0.5% of halogen, on an atomic basis, in the quaternary chalcogen silane.

In one or more embodiments, the chalcogen precursors are synthesized in a one step synthesis process. In some embodiments, the synthesis yields chalcogen precursors with high purity. In some embodiments, the one step synthesis process may be based on an ammonolysis reaction. In some embodiments, the ammonolysis reaction may be described by reaction scheme (I).

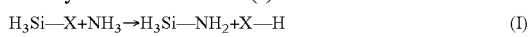

wherein X comprises a chalcogen or a derivative thereof.

In one or more embodiments, the chalcogen precursor is used to deposit silicon nitride ($Si_xN_y$) films under ALD and CVD conditions. The process of various embodiments uses vapor deposition techniques, such as an atomic layer deposition (ALD) or chemical vapor deposition (CVD). The chalcogen precursors of one or more embodiments are volatile and thermally stable, and, thus, suitable for vapor deposition.

In one or more embodiments, the chalcogen precursor has a thermal stability at a temperature in a range of from 50° C. to 500° C., from 50° C. to 400° C., from 50° C. to 300° C., from 50° C. to 200° C., from 50° C. to 100° C., from 100° C. to 500° C., from 100° C. to 400° C. from 100° C. to 300° C. from 100° C. to 200° C., from 200° C. to 500° C., from 200° C. to 400° C. or from 200° C. to 300° C.

In one or more embodiments, the chalcogen precursor exists as a liquid.

In one or more embodiments, the chalcogen precursor reacts with amines at a temperature in a range of from 15° C. to 100° C., from 20° C. to 100° C. or from 25° C. to 100° C. In some embodiments, the chalcogen precursor reacts with amines at room temperature. As used herein, the term "room temperature" refers to a temperature in a range of from 15° C. to 30° C. In some embodiments, the chalcogen precursor spontaneously reacts with amines at a temperature in a range of from 15° C. to 100° C., from 20° C. to 100° C. or from 25° C. to 100° C.

The chalcogen precursors of one or more embodiments are substantially free of halogen. In some embodiments, the use of chalcogen precursors that are substantially free of halogen provides silicon nitride ($Si_xN_y$) films that are substantially free of halogen. As used herein, the term "substantially free" means that there is less than about 5%, including less than about 4%, less than about 3%, less than about 2%, less than about 1%, and less than about 0.5% of halogen on an atomic basis in the silicon nitride ($Si_xN_y$) film.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Without intending to be bound by theory, it is thought that the presence of halogens in the structure of the precursors can pose challenges, as halogen contamination may affect device performance and hence require additional removal procedures.

Silicon nitride ($Si_xN_y$) films can be grown by atomic layer deposition or chemical vapor deposition for many applications. One or more embodiments of the disclosure advantageously provide processes for atomic layer deposition or chemical vapor deposition to form silicon nitride ($Si_xN_y$) films.

The skilled artisan will recognize that the use of a molecular formula like $Si_xN_y$ does not imply a specific stoichiometric relationship between the elements but merely the identity of the major components of the film. For example, $Si_xN_y$ refers to a film whose major composition comprises silicon and nitrogen atoms. In some embodiments, the major composition of the specified film (i.e., the sum of the atomic percent of the specified atoms) is greater than or equal to about 95%, 98%, 99% or 99.5% of the film, on an atomic basis.

With reference to FIG. 1, one or more embodiments of the disclosure are directed to method 100 of depositing a film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In one or more embodiments, an adhesion layer, such as titanium nitride, is deposited at operation 105.

At deposition 110, a process is performed to deposit a silicon nitride ($Si_xN_y$) film on the substrate (or substrate surface). The deposition process can include one or more operations to form the silicon nitride ($Si_xN_y$) film on the substrate. In operation 112, the substrate (or substrate surface) is exposed to a chalcogen precursor to deposit a precursor film on the substrate (or substrate surface). The chalcogen precursor can be any suitable chalcogen-containing compound that can react with (i.e., adsorb or chemisorb onto) the substrate surface to leave a silicon nitride species on the substrate surface.

Current silane precursors for ALD of silicon nitride ($Si_xN_y$) films use halogen substituents, which provide sufficient stability at the expense of reduced reactivity, increasing process temperature. Accordingly, one or more embodiments use the one or more chalcogen precursors or derivatives thereof. In some embodiments, the chalcogen precursors or derivatives thereof are substantially halogen free. In some embodiments, the chalcogen precursors comprises less than about 5%, including less than about 4%, less than about 3%, less than about 2%, less than about 1%, and less than about 0.5% of halogen on an atomic basis. The chalcogen precursors comprise improved thermal stability, while retaining high volatility.

In one or more embodiments, the chalcogen precursor comprises a silane having one or more chalcogens or derivatives thereof. In one or more embodiments, the chalcogen is selected from the group consisting of sulfur (S), selenium (Se), and tellurium (Te). In one or more embodiments, the chalcogen precursor comprises one or more of a thiosilane, a selinosilane and a tellurosilane. In some embodiments, the chalcogen precursors has a structure according to Formula (I) $Me_nSi(MR)_{4-n}$ or Formula (II) $Si(MR)_4$, wherein n is from 3 to 1, M is selected from the group consisting of sulfur (S), selenium (Se), and tellurium (Te), and R is selected from the group consisting of alkyl or phenyl derivatives. In some embodiments, the alkyl comprises $CH_3CH_2$ and/or $CH_3CH_2CH_2$. In some embodiments, the phenyl derivative comprises p-Me-$C_6H_4$.

Unless otherwise indicated, the term "lower alkyl," "alkyl," or "alk" as used herein alone or as part of another group includes both straight and branched chain hydrocarbons, containing 1 to 20 carbons, or 1 to 10 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

In some embodiments, the chalcogen precursor comprises a pseudohalide derivative of chalcogen. As used herein, the term "pseudohalogen" refers to polyatomic analogues of halogens, whose chemistry permits them to substitute for halogens. In some embodiments, the pseudohalide derivative comprises thiocyanate, isothiocyanate, selenocyanate, and/or tellurocyanate.

In one or more embodiments, the chalcogen precursor comprises a chalcogen moiety. In some embodiment, the chalcogen moiety is selected from the group consisting of -MH, -MF, -MCF$_3$, -MC(CH$_3$)$_3$, -MCH$_3$, -MPh, -MPh-(p-CH$_3$), -MPh-(2,4,6-CH$_3$), -MPh-(p-CF$_3$), and -MPh-(p-NO$_2$), wherein M is selected from the group consisting of sulfur (S), selenium (Se), and tellurium (Te). In some embodiments, the chalcogen is substantially free of halogen. In some embodiments, the chalcogen moiety of the halogen free chalcogen is selected from the group consisting of -MH, -MC(CH$_3$)$_3$, -MCH$_3$, -MPh, -MPh-(p-CH$_3$), -MPh-(2,4,6-CH$_3$) and -MPh-(p-NO$_2$), wherein M is selected from the group consisting of sulfur (S), selenium (Se), and tellurium (Te).

In one or more embodiments, the chalcogen precursor comprises a silane having one or more thiol (—SH) or derivatives thereof. In one or more embodiments, the chalcogen precursor comprises one or more thiosilanes. In some embodiments, the chalcogen precursor has a structure according to Formula (I) $Me_nSi(SR)_{4-n}$ or Formula (II) $Si(SR)_4$, wherein n is from 3 to 1, R is selected from the group consisting of alkyl or phenyl derivatives. In some embodiments, the alkyl comprises $CH_3CH_2$ and/or $CH_3CH_2CH_2$. In some embodiments, the phenyl derivative comprises p-Me-$C_6H_4$.

In one or more embodiments, the thiosilane comprises a thiol moiety. In some embodiment, the thiol moiety is selected from the group consisting of —SH, —SF, —SCF$_3$, —SC(CH$_3$)$_3$, —SCH$_3$, —SPh, —SPh-(p-CH$_3$), —SPh-(2,4,6-CH$_3$), —SPh-(p-CF$_3$), and —SPh-(p-NO$_2$). In some embodiments, the thiosilane is substantially free of halogen. In some embodiments, the thiol moiety of the halogen free thiosilane is selected from the group consisting of —SH, —SC(CH$_3$)$_3$, —SCH$_3$, —SPh, —SPh-(p-CH$_3$), —SPh-(2,4,6-CH$_3$) and —SPh-(p-NO$_2$).

In some embodiments, the thiosilane is synthesized via a one step reaction in tetrahydrofuran from a corresponding starting halosilane via nucleophilic substitution of the halogen atom with thiolate in the presence of trimethylamine. In some embodiments, the one pot synthesis results in complete conversion to the thiosilane product with high purity directly from the crude reaction mixture without carrying out any further purification. In some embodiments, a side product triethylamine salt (Et$_3$NHCl) is produced that may be separated from the thiosilane via filtration. The synthesis of the thiosilane can be carried out in a number of organic solvents such as acetonitrile, toluene, and the like using different amine bases. In some embodiments, the thiosilane is liquid with suitable vapour pressure and high thermal stability making it suitable for delivery by ALD. In some embodiments, the thiosilane undergoes a substitution reaction with amines via substitution of the thiolate group by an amine at low temperature.

In one or more embodiments, the thiosilane has an activation barrier based on quantum chemical calculations. In some embodiments, the activation barrier is in a range of from 18.1 kcal/mol to 32.2 kcal/mol.

In one or more embodiments, the chalcogen precursor comprises a silane having one or more selino (—SeH) or derivatives thereof. In one or more embodiments, the chalcogen precursor comprises one or more selinosilanes. In some embodiments, the selinosilane has a structure according to Formula (I) $Me_nSi(SeR)_{4-n}$ or Formula (II) $Si(SeR)_4$, wherein n is from 3 to 1, and R is selected from the group consisting of alkyl or phenyl derivatives. In some embodiments, the alkyl comprises $CH_3CH_2$ and/or $CH_3CH_2CH_2$. In some embodiments, the phenyl derivative comprises p-Me-$C_6H_4$.

In one or more embodiments, the selinosilane comprises a selino moiety. In some embodiment, the selino moiety is selected from the group consisting of —SeH, —SeF, —SeCF$_3$, —SeC(CH$_3$)$_3$, —SeCH$_3$, —SePh, —SePh-(p-CH$_3$), —SePh-(2,4,6-CH$_3$), —SePh-(p-CF$_3$), and —SePh-(p-NO$_2$). In some embodiments, the selinosilane is substantially free of halogen. In some embodiments, the selino moiety of the halogen free selinosilane is selected from the group consisting of —SeH, —SeC(CH$_3$)$_3$, —SeCH$_3$, —SePh, —SePh-(p-CH$_3$), —SePh-(2,4,6-CH$_3$) and —SePh-(p-NO$_2$).

In one or more embodiments, the chalcogen precursor comprises a silane having one or more telluro (—TeH) or derivatives thereof. In one or more embodiments, the chalcogen precursor comprises tellurosilane. In some embodiments, the tellurosilane has a structure according to Formula (I) $Me_nSi(SeR)_{4-n}$ or Formula (II) $Si(SeR)_4$, wherein n is from 3 to 1, and R is selected from the group consisting of alkyl or phenyl derivatives. In some embodiments, the alkyl comprises $CH_3CH_2$ and/or $CH_3CH_2CH_2$. In some embodiments, the phenyl derivative comprises p-Me-$C_6H_4$.

In one or more embodiments, the tellurosilane comprises a telluro moiety. In some embodiments, the telluro moiety is selected from the group consisting of —TeH, —TeF, —TeCF$_3$, —TeC(CH$_3$)$_3$, —TeCH$_3$, —TePh, —TePh-(p-CH$_3$), —TePh-(2,4,6-CH$_3$), —TePh-(p-CF$_3$), and —TePh-(p-NO$_2$). In some embodiments, the tellurosilane is substantially free of halogen. In some embodiments, the telluro moiety of the halogen free tellurosilane is selected from the group consisting of —TeH, —TeC(CH$_3$)$_3$, —TeCH$_3$, —TePh, —TePh-(p-CH$_3$), —TePh-(2,4,6-CH$_3$) and —TePh-(p-NO$_2$).

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the silicon nitride ($Si_xN_y$) layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate. For example, in some embodiments, a layer comprising a metal, a nitride, an oxide, or the like, or combinations thereof may be disposed on the substrate and may have the silicon nitride ($Si_xN_y$) layer formed upon such layer or layers.

At operation 114, the processing chamber is optionally purged to remove unreacted chalcogen precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the chalcogen precursor by any suitable technique including, but not limited to, moving the substrate through a gas curtain to a portion or sector of the processing chamber that contains none or substantially none of the chalcogen precursor. In some embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar).

At operation 116, the substrate (or substrate surface) is exposed to a reactant to form one or more of a silicon nitride ($Si_xN_y$) film on the substrate. The reactant can react with the chalcogen-containing species on the substrate surface to form the silicon nitride ($Si_xN_y$) film. In some embodiments, the reactant comprises a reducing agent. In one or more embodiments, the reducing agent can comprise any reducing agent known of to one of skill in the art. In further embodiments, the reactant comprises one or more reducing agent.

In specific embodiments, the reactant is selected from one or more of 1,1-dimethylhydrazine (DMH), alkyl amine, hydrazine, alkyl hydrazine, allyl hydrazine, hydrogen ($H_2$), ammonia ($NH_3$), nitrous oxide ($N_2O$), and plasmas thereof. In some embodiments, the alkyl amine is selected from one or more of tert-butyl amine ($tBuNH_2$), isopropyl amine ($iPrNH_2$), ethylamine ($CH_3CH_2NH_2$), diethylamine (($CH_3CH_2)_2NH$), or butyl amine ($BuNH_2$). In some embodiments, the reactant comprises one or more of compounds with the formula $R'NH_2$, $R'_2NH$, $R'_3N$, $R'_2SiNH_2$, $(R'_3Si)_2NH$, $(R'_3Si)_3N$; where each R' is independently H or an alkyl group having 1-12 carbon atoms. In some embodiments, the alkyl amine consists essentially of one or more of tert-butyl amine ($tBuNH_2$), isopropyl amine ($iPrNH_2$), ethylamine ($CH_3CH_2NH_2$), diethylamine (($CH_3CH_2)_2NH$), butyl amine ($BuNH_2$).

At operation 118, the processing chamber is optionally purged after exposure to the reactant. Purging the processing chamber in operation 118 can be the same process or different process than the purge in operation 114. Purging the processing chamber, portion of the processing chamber, area adjacent the substrate surface, etc., removes unreacted reactant, reaction products and by-products from the area adjacent the substrate surface.

At decision 120, the thickness of the deposited film, or number of cycles of chalcogen precursor and reactant is considered. If the deposited film has reached a predetermined thickness or a predetermined number of process cycles have been performed, the method 100 moves to an optional post-processing operation 130. In some embodiments, the process cycle comprises sequential exposure of the substrate to the chalcogen precursor, purge gas, reactant and purge gas. If the thickness of the deposited film or the number of process cycles has not reached the predetermined threshold, the method 100 returns to operation 110 to expose the substrate surface to the chalcogen precursor again in operation 112, and continuing.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film. In one or more embodiments, annealing can also with performed with a gas under plasma. In one or more embodiments, the annealing temperature may be lower with plasma.

In one or more embodiments, the plasma comprises one or more of nitrogen ($N_2$), argon (Ar), helium (He), hydrogen ($H_2$), carbon monoxide (CO), carbon dioxide ($CO_2$) methane ($CH_4$), and ammonia ($NH_3$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

The method 100 can be performed at any suitable temperature depending on, for example, the chalcogen precursor, reactant or thermal budget of the device. In one or more embodiments, the use of high temperature processing may be undesirable for temperature-sensitive substrates, such as logic devices. In a particular embodiment, the method 100 is a plasma-free deposition method. In some embodiments, the method 100 is performed at a low temperature. In some embodiments, the method is performed at a temperature in a range of from 20° C. to 650° C. In some embodiments, the method 100 is performed at low temperature without the use of plasma.

In some embodiments, exposure to the chalcogen precursor (operation 112) and the reactant (operation 116) occur at the same temperature. In some embodiments, the substrate is maintained at a temperature in a range of from 20° C. to 650° C., from 20° C. to 500° C., from 20° C. to 400° C., from 20° C. to 300° C., from 50° C. to 650° C., from 50° C. to 550° C., from 50° C. to 500° C., from 50° C. to 400° C., from 50° C. to 300° C., from 100° C. to 650° C., from 100° C. to 550° C., from 100° C. to 500° C., from 100° C. to 400° C. or from 100° C. to 300° C. In some embodiments, the substrate is maintained at a temperature in a range of from 20° C. to <650° C., from 20° C. to <500° C., from 20° C. to <400° C., from 20° C. to <300° C., from 50° C. to <650° C., from 50° C. to <550° C., from 50° C. to <500° C., from 50° C. to <400° C., from 50° C. to <300° C., from 100° C. to <650° C., from 100° C. to <550° C., from 100° C. to <500° C., from 100° C. to <400° C. or from 100° C. to <300° C.

In some embodiments, exposure to the chalcogen precursor (operation 112) occurs at a different temperature than the exposure to the reactant (operation 116). In some embodiments, the substrate is exposed to the chalcogen precursor (operation 112) at a first temperature in a range of from 20° C. to 650° C., from 20° C. to 500° C., from 20° C. to 400° C., from 20° C. to 300° C., from 50° C. to 650° C., from 50° C. to 550° C., from 50° C. to 500° C., from 50° C. to 400° C., from 50° C. to 300° C., from 100° C. to 650° C., from 100° C. to 550° C., from 100° C. to 500° C., from 100° C. to 400° C. or from 100° C. to 300° C. In some embodiments, the substrate is exposed to the chalcogen precursor (operation 112) at a first temperature in a range of from 20° C. to <650° C., from 20° C. to <500° C., from 20° C. to <400° C., from 20° C. to <300° C., from 50° C. to <650° C., from 50° C. to <550° C., from 50° C. to <500° C., from 50° C. to <400° C., from 50° C. to <300° C., from 100° C. to <650° C., from 100° C. to <550° C., from 100° C. to <500° C., from 100° C. to <400° C. or from 100° C. to <300° C. In some embodiments, the reactant is reacted with the precursor film (operation 116) at a temperature in a range of from 20° C. to 650° C., from 20° C. to 500° C., from 20° C. to 400° C., from 20° C. to 300° C., from 50° C. to 650° C., from 50° C. to 550° C., from 50° C. to 500° C., from 50° C. to 400° C., from 50° C. to 300° C., from 100° C. to 650° C., from 100° C. to 550° C., from 100° C. to 500° C., from 100° C. to 400° C. or from 100° C. to 300° C. In some embodiments, the reactant is reacted with the precursor film (operation 116) at a temperature in a range of from 20° C. to <650° C., from 20° C. to <500° C., from 20° C. to <400° C., from 20° C. to <300° C., from 50° C. to <650° C., from 50° C. to <550° C., from 50° C. to <500° C., from 50° C. to <400° C., from 50° C. to <300° C., from 100° C. to <650° C., from 100° C. to <550° C., from 100° C. to <500° C., from 100° C. to <400° C. or from 100° C. to <300° C.

In the embodiment illustrated in FIG. 1, at deposition operation 110 the substrate (or substrate surface) is exposed to the chalcogen precursor and the reactant sequentially. In another, un-illustrated, embodiment, the substrate (or substrate surface) is exposed to the chalcogen precursor and the reactant simultaneously in a CVD reaction. In a CVD reaction, the substrate (or substrate surface) can be exposed to a gaseous mixture of the chalcogen precursor and reactant to deposit a silicon nitride ($Si_xN_y$) film having a predetermined thickness. In the CVD reaction, the silicon nitride ($Si_xN_y$) film can be deposited in one exposure to the mixed reactive gas, or can be multiple exposures to the mixed reactive gas with purges between.

The deposition operation 110 can be repeated to form a silicon nitride ($Si_xN_y$) film having a predetermined thickness. In some embodiments, the deposition operation 110 is repeated to provide the silicon nitride ($Si_xN_y$) film having a thickness in the range of from 0.3 nm to 3000 nm, from 0.3 nm to 2000 nm, from 0.3 nm to 1000 nm, from 0.3 nm to 500 nm, from 0.3 nm to 400 nm, from 0.3 nm to 300 nm, from 0.3 nm to 200 nm, from 0.3 nm to 100 nm, from 1 nm to 3000 nm, from 1 nm to 2000 nm, from 1 nm to 1000 nm, from 1 nm to 500 nm, from 1 nm to 400 nm, from 1 nm to 300 nm, from 1 nm to 200 nm or from 1 nm to 100 nm.

One or more embodiments of the disclosure are directed to methods of depositing silicon nitride ($Si_xN_y$) films in high aspect ratio features. A high aspect ratio feature is a trench, via or pillar having a height:width ratio greater than or equal to about 10, 20, or 50, or more. In some embodiments, the silicon nitride ($Si_xN_y$) film is deposited conformally on the high aspect ratio feature. As used in this manner, a conformal film has a thickness near the top of the feature that is in the range of about 80-120% of the thickness at the bottom of the feature.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Olympia® and the Continuum®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

For each of the selected thiosilanes, ($H_3Si$—X), that are involved in the ammonolysis reaction scheme I, DFT calculations were performed using M06-2X/6-311G(d,p) level of theory.

$H_3Si$—$X$+$NH_3$→$H_3Si$—$NH_2$+$X$—$H$     (I)

The reaction energy (ΔG) and reaction barrier (ΔG$^\ne$) for the ammonolysis reaction are summarized in Table 1.

TABLE 1

Transition State Calculations

| X | Reaction Energy (ΔG), kcal/mol | Reaction Barrier (ΔG$^\ne$), kcal/mol |
|---|---|---|
| SCF$_3$ | 0.1 | 18.1 |
| SF | −0.7 | 21.5 |
| SH | −1.4 | 28.6 |
| SCH$_3$ | −0.9 | 31.4 |
| SC(CH$_3$)$_3$ | −2.3 | 32.2 |
| SPh | 0 | 26.4 |
| SPh-(p-NO$_2$) | −0.7 | 23.4 |
| SPh-(p-CF$_3$) | −0.1 | 25.2 |
| SPh-(p-CH$_3$) | 0.3 | 26.2 |
| SPh-(2,4,6-CH$_3$) | 0.3 | 28.2 |

Thermally stable halogen-free quaternary thiosilanes [Me$_n$Si(p-Me-C$_6$H$_4$S)$_{4-n}$ and Si(SR)$_4$] (where n=3 to 1, R=CH$_3$CH$_2$, CH$_3$CH$_2$CH$_2$ and p-Me-C$_6$H$_4$) were designed and synthesized in industrial scale via a one step reaction under mild conditions. The reaction is described according to the reaction scheme (II):

(II)

The thiosilanes represented by structures (I)-(VI) were synthesized in tetrahydrofuran from their corresponding starting halosilanes via nucleophilic substitution of the halogen atom with thiolate in the presence of triethylamine as a base. The one pot synthesis resulted in complete conversion to the thiosilane product with high purity directly from the crude reaction mixture without carrying out any further purification. During the synthesis, a side product triethylamine salt (Et$_3$NHCl) was produced that was separated out from the thiosilane product via filtration. The synthesis of the thiosilanes was carried out in a number of organic solvents, including but not limited to acetonitrile and toluene, using different amine bases.

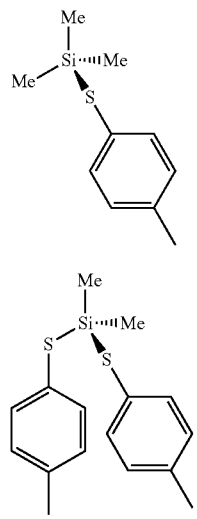

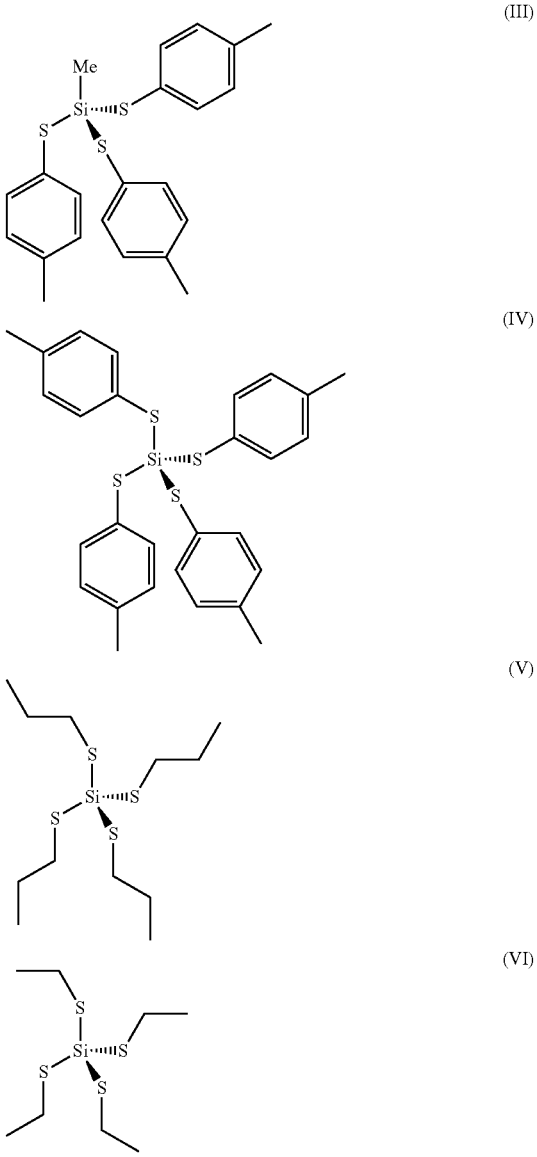

The identity of the thiosilanes was confirmed spectroscopically. All of the thiosilanes existed as liquids. Also, all of the thiosilanes were found to be thermally stable at a temperature in a range of from 50° C. to 550° C. The thiosilanes were found to be suitable for delivery in an ALD tool. The thiosilanes were found to be reactive towards all type of amines at a temperature in a range of from 25° C. to 100° C. All the thiosilanes (I-VI) contain a number of Si—S bonds which are prone to undergo nucleophilic substitution reaction in the presence of a nucleophile because of the low Si—S bond energy. In particular, all the Si—S bonds in the thiosilanes (I-VI) were subjected to nucleophilic substitution reaction with a nucleophile, ammonia (NH$_3$), and formed Si—NH$_2$ together with a thiol (RSH) side product.

Example 2

Atomic Layer Deposition of Chalcogen Containing Films

General procedure: A silicon substrate is placed in a processing chamber. A chalcogen precursor is flowed into the processing chamber in an atmosphere of nitrogen ($N_2$) gas over the silicon substrate leaving a chalcogen-precursor terminated surface. Unreacted precursor and byproducts are then purged out of the chamber. Next, a co-reactant is then introduced into the chamber that reacts with the surface-bound chalcogen species. Again, excess coreactant and byproducts are removed from the chamber. The resultant material on the substrate is a chalcogen-containing film.

Spatially relative terms, such as "beneath," "below," "lower," "above," "upper" and the like, may be used herein for ease of description to describe one element or feature's relationship to another element(s) or feature(s) as illustrated in the FIGURE. It will be understood that the spatially relative terms are intended to encompass different orientations of the device in use or operation in addition to the orientation depicted in the FIGURE. For example, if the device in the FIGURE is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
exposing a substrate to a chalcogen precursor, the chalcogen precursor comprising one or more of a thiosilane, a selinosilane, and a tellurosilane and having a structure of Formula (I) $Me_nSi(MR)_{4-n}$ or Formula (II) $Si(MR)_4$, wherein n is from 3 to 1, M is selected from the group consisting of sulfur (S), selenium (Se), and tellurium (Te), and R is selected from the group consisting of Ph, Ph-(p-$CH_3$), Ph-(2,4,6-$CH_3$), Ph-(p-$CF_3$), and Ph-(p-$NO_2$); and
exposing the substrate to a reactant to form a silicon nitride ($Si_xN_y$) film on the substrate.

2. The method of claim 1, wherein the substrate is exposed to the chalcogen precursor at a temperature in a range of from 100° C. to 550° C.

3. The method of claim 1, wherein the method comprises one or more of chemical vapor deposition or atomic layer deposition.

4. The method of claim 3, wherein the substrate is exposed to the chalcogen precursor and the reactant simultaneously.

5. The method of claim 3, wherein the substrate is exposed to the chalcogen precursor and the reactant sequentially.

6. The method of claim 1, further comprising purging the substrate of the chalcogen precursor prior to exposing the substrate to the reactant.

7. The method of claim 6, wherein purging comprises one or more of applying a vacuum or flowing a purge gas over the substrate.

8. The method of claim 7, wherein the purge gas comprises one or more of nitrogen ($N_2$), helium (He), and argon (Ar).

9. The method of claim 1, wherein the reactant comprises one or more of dimethylhydrazine (DMH), alkyl amine, hydrazine, alkyl hydrazine, allyl hydrazine, hydrogen ($H_2$), and ammonia ($NH_3$).

10. The method of claim 1, wherein the film is substantially free of halogen.

11. A method of depositing a halogen-free film, the method comprising:
forming a silicon nitride ($Si_xN_y$) film in a process cycle comprising sequential exposure of a substrate to a chalcogen precursor, purge gas, reactant, and purge gas, the chalcogen precursor comprising one or more of a thiosilane, a selinosilane, and a tellurosilane and a pseudohalide derivative, the pseudohalide derivative selected from the group consisting of thiocyanate, isothiocyanate, selenocyanate, and tellurocyanate.

12. The method of claim 11, wherein the reactant comprises one or more of dimethylhydrazine (DMH), alkyl amine, hydrazine, alkyl hydrazine, allyl hydrazine, hydrogen ($H_2$), and ammonia ($NH_3$).

* * * * *